US012711854B2

(12) United States Patent
Yu et al.

(10) Patent No.: US 12,711,854 B2
(45) Date of Patent: Aug. 18, 2026

(54) BROKEN WIRE DETECTION WITHIN A SECURITY SURVEILLANCE NETWORK

(71) Applicant: Robert Bosch GmbH, Stuttgart (DE)

(72) Inventors: Zhen Yu, Fairport, NY (US); Michael Travers, Penfield, NY (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 19/005,708

(22) Filed: Dec. 30, 2024

(65) Prior Publication Data

US 2026/0188105 A1 Jul. 2, 2026

(51) Int. Cl.
*G08B 29/12* (2006.01)
*G01R 31/54* (2020.01)

(52) U.S. Cl.
CPC .......... *G08B 29/123* (2013.01); *G01R 31/54* (2020.01)

(58) Field of Classification Search
CPC .............................. G08B 29/123; G01R 31/54
See application file for complete search history.

(56) References Cited

U.S. PATENT DOCUMENTS 6,978,340 B2 12/2005 Fisher et al.
7,282,927 B1 * 10/2007 Burkatovsky ...... G05B 19/0425 324/672
7,484,019 B2 1/2009 Tu
7,685,339 B2 3/2010 Tsai et al.
8,412,789 B2 4/2013 Petricoin, Jr.
9,568,534 B2 2/2017 Martin et al.
9,946,675 B2 4/2018 Biskup
10,031,875 B2 7/2018 Krenik et al.
10,360,170 B2 7/2019 Kao et al.
10,516,592 B2 12/2019 Hirata
10,678,729 B1 6/2020 Kwon
11,500,429 B2 11/2022 Machuletz et al.
11,586,573 B2 2/2023 Reed et al.
11,609,543 B2 3/2023 Tomanovic et al.
12,531,408 B2 * 1/2026 Krause .................. G01R 31/54
2005/0021712 A1 1/2005 Chassapis et al.

(Continued)

OTHER PUBLICATIONS

Extended European Search Report for Application No. 25225692.0 dated Apr. 30, 2026 (9 pages).

*Primary Examiner* — An T Nguyen
(74) *Attorney, Agent, or Firm* — Michael Best & Friedrich LLP

(57) ABSTRACT

Systems and methods directed to electronic communications system expander device. The device includes a differential receiver, an electronic processor, and a broken wire detection circuit including a load resistor selectively connectable to an input of the detection circuit, the circuit being communicatively coupled at the input to a differential communications bus and communicatively coupled at an output to the processor. The processor is configured to transmit a message over the bus to an electronic communications device, detect, at the differential receiver, a message over the bus from the communications device, and connect, in response to detecting the response message, the load resistor to the input of the detection circuit. The processor is further configured to disconnect, during reception of the message from the communications device, the load resistor and determine, based on a signal from the circuit, whether a broken wire condition exists within the bus.

19 Claims, 5 Drawing Sheets

(56) References Cited

U.S. PATENT DOCUMENTS

| | | | |
|---|---|---|---|
| 2009/0082912 | A1 | 3/2009 | Melman |
| 2013/0285799 | A1 | 10/2013 | Probin et al. |
| 2016/0020601 | A1 | 1/2016 | Vijayaganesh |
| 2017/0039841 | A1 | 2/2017 | Wilson et al. |
| 2017/0270321 | A1 | 9/2017 | Hosey |
| 2017/0324606 | A1 | 11/2017 | Hobbs |
| 2018/0367347 | A1 | 12/2018 | Gscheidle |
| 2019/0386703 | A1 | 12/2019 | Rajapaksha et al. |
| 2020/0097433 | A1 | 3/2020 | Qi et al. |
| 2020/0389469 | A1 | 12/2020 | Litichever et al. |
| 2021/0350237 | A1 | 11/2021 | Litichever et al. |
| 2022/0046114 | A1 | 2/2022 | Entelis et al. |
| 2022/0147481 | A1 | 5/2022 | Hirst et al. |
| 2023/0133042 | A1 | 5/2023 | Whiteford et al. |
| 2024/0302824 | A1 | 9/2024 | Alaghehband et al. |

* cited by examiner

BROKEN WIRE DETECTION WITHIN A SECURITY SURVEILLANCE NETWORK

FIELD

This application relates generally to the field of wired serial communications networks for a security surveillance system.

BACKGROUND

Security surveillance systems may be implemented using a serial communications network that connects a control panel to various peripheral devices. Peripheral devices in surveillance systems may include sensors (for example, surveillance cameras, infrared sensors, RFID/card scanners, etc.), human interface devices (for example, keypads, touch-screen displays, etc.), and output devices (for example, audio alarms, visual alert systems, etc.). The control panel may communicate with each of these peripheral devices via wired, half-duplex communications.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate aspects, examples, aspects, and features of concepts that include the claimed subject matter and explain various principles and advantages of those aspects, examples, aspects, and features.

Figure 1:
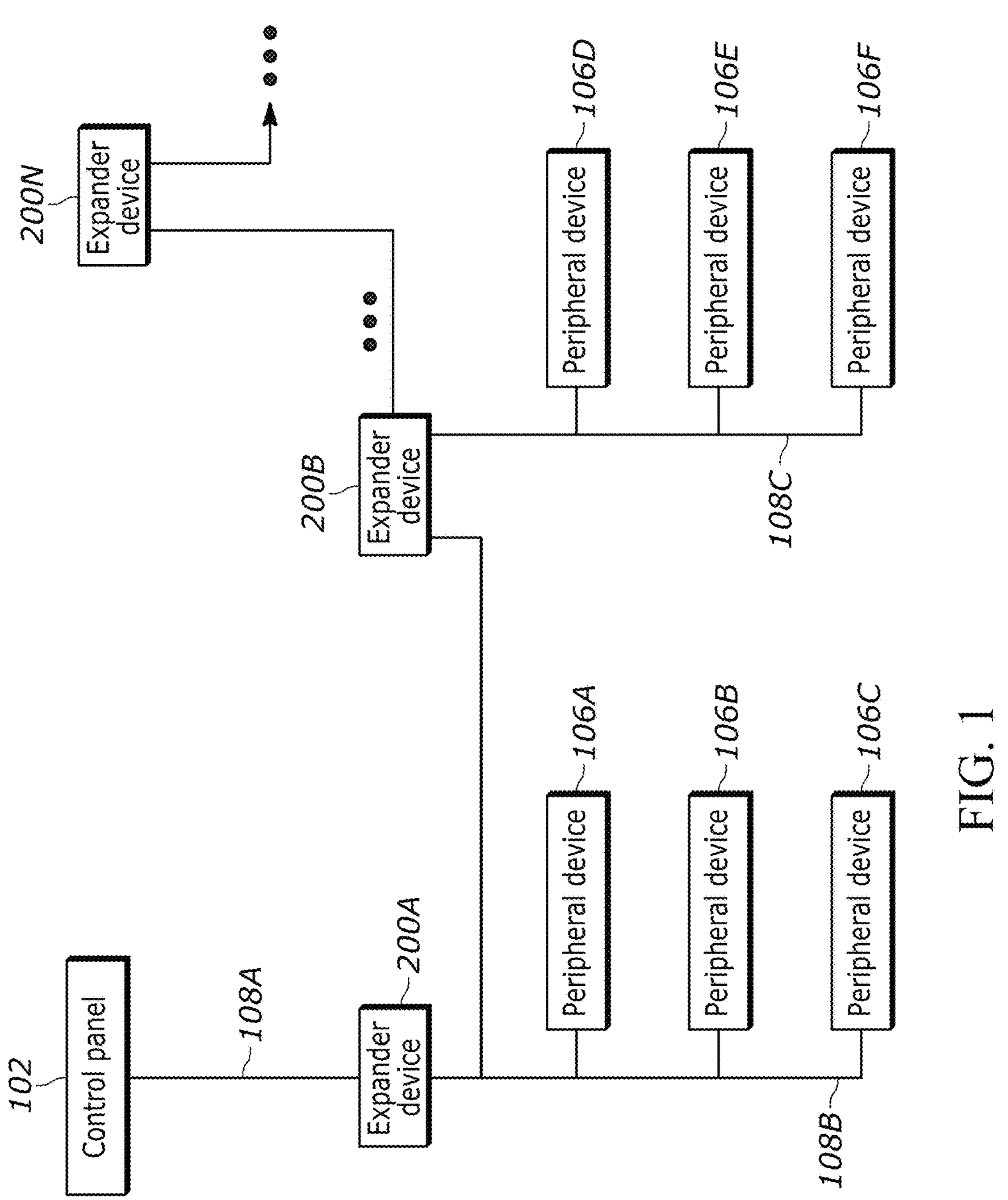
FIG. 1 is a block diagram illustrating an electronic communications network system according to various examples.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of examples, aspects, and features illustrated.

In some instances, the apparatus and method components have been represented where appropriate by conventional symbols in the drawings, showing only those specific details that are pertinent to understanding the of various aspects, examples, aspects, and features so as not to obscure the disclosure with details that will be readily apparent to those of ordinary skill in the art having the benefit of the description herein.

DETAILED DESCRIPTION

Security surveillance systems may include a wired communications network. Such systems may be implemented, for example, for a large premise (for example, an airport, a warehouse, a mall, an exhibition center, etc.) and may include several peripheral devices (e.g., devices on the edge of the network) in communication with a central control panel. The wired communications network, in some instances, may be a half-duplex differential communications network.

To maintain integrity of the security system, some systems may implement one or more solutions for detecting occurrences of a broken wire within the communications network. One solution, for example, is to measure a current flow within a communication loop of the network itself. The current may be measured via an end of line (EOL) resistor (also known as a load resistor) positioned at a far end of the loop (for example, a peripheral device at an edge of the communication loop/chain). The central control panel may transmit a message to the edge device and, in instances where the loop is closed, the control panel will receive a response from the edge device. However, in networks where more than one loop is present, an EOL for each of the edge devices of each respective loop would be necessary, which may be expensive and complicate installation (and subsequent modification) of the network.

Accordingly, the systems and methods described herein relate to broken wire detection within a wired half-duplex differential communications network of a security surveillance system.

In some aspects, the techniques described herein relate to broken wire detection within a wired serial half-duplex communications network. Some aspects relate to an electronic communications system expander device communicatively coupled via a first differential half-duplex communications bus to and upstream from an electronic communications device. The electronic communications system expander device includes a differential receiver, an electronic processor, and a broken wire detection circuit including a load resistor selectively connectable to an input of the broken wire detection circuit. The broken wire detection circuit is communicatively coupled at the input to the first differential half-duplex communications bus and communicatively coupled at an output to the electronic processor. The electronic processor is configured to transmit a first message over the first differential half-duplex communications bus to the electronic communications device, detect, at the differential receiver, a response message over the first differential half-duplex communications bus from the electronic communications device, connect, in response to detecting the response message, the load resistor to the input of the broken wire detection circuit, and disconnect, during reception of the response message from the electronic communications device, the load resistor from the input of the broken wire detection circuit. The electronic processor is further configured to determine, based on a signal from the broken wire detection circuit, whether a broken wire condition exists within the first differential half-duplex communications bus and generate, in response to determining that the broken wire condition is present, an alert to a user.

Some aspects relate to electronic communications network system including an electronic communications device and an expander device communicatively coupled via a first differential half-duplex communications bus to and upstream from the electronic communications device, the electronic communications system expander device including a differential receiver, an electronic processor, and a broken wire detection circuit. The broken wire detection circuit includes a load resistor selectively connectable to an input of the broken wire detection circuit, the broken wire detection circuit being communicatively coupled at the input to the first differential half-duplex communications bus and communicatively coupled at an output to the electronic processor. The electronic processor is configured to transmit a first message over the first differential half-duplex communications bus to the electronic communications device, detect, at the differential receiver, a response message over the first differential half-duplex communications bus from the electronic communications device, and connect, in response to detecting the response message, the load resistor to the input of the broken wire detection circuit. The electronic processor is further configured to disconnect, during reception of the response message from the electronic communications device, the load resistor from the input of the broken wire detection circuit, determine, based on a signal from the broken wire detection circuit, whether a broken wire condition exists within the first differential half-duplex communications bus, and generate, in response to determining that the broken wire condition is present, an alert to a user.

Some aspects relate to a method of detecting a broken wire condition of a first differential half-duplex communications bus. The method includes transmitting, from an electronic communications system expander device, a first message over the first differential half-duplex communications bus to an electronic communications device connected downstream from the electronic communications system expander device, detecting, at a differential receiver of the electronic communications system expander device, a response message over the first differential half-duplex communications bus from the electronic communications device, and connecting, in response to detecting the response message, a load resistor of a broken wire detection circuit of the electronic communications system expander device to an input of the broken wire detection circuit, the broken wire detection circuit being connected to the first differential half-duplex communications bus at the input. The method further includes disconnecting, during reception of the response message from the electronic communications device, the load resistor from the input of the broken wire detection circuit, determining, based on a signal from the broken wire detection circuit, whether a broken wire condition exists within the first differential half-duplex communications bus, and generating, in response to determining that the broken wire condition is present, an alert to a user.

Before any aspects, features, or instances are explained in detail, it is to be understood that the aspects, features, or instances are not limited in their application to the details of construction and the arrangement of components set forth in the following description or illustrated in the following drawings. Other instances are possible and are capable of being practiced or of being carried out in various ways.

It should also be noted that a plurality of hardware and software-based devices, as well as a plurality of different structural components may be utilized in various implementations. Aspects, features, and instances may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one instance, the electronic based aspects of the invention may be implemented in software (for example, stored on non-transitory computer-readable medium) executable by one or more processors. As a consequence, it should be noted that a plurality of hardware and software-based devices, as well as a plurality of different structural components may be utilized to implement the invention. For example, "control units" and "controllers" described in the specification can include one or more electronic processors, one or more memories including a non-transitory computer-readable medium, one or more input/output interfaces, and various connections (for example, a system bus) connecting the components.

Unless the context of their usage unambiguously indicates otherwise, the articles "a," "an," and "the" should not be interpreted as meaning "one" or "only one." Rather these articles should be interpreted as meaning "at least one" or "one or more." Likewise, when the terms "the" or "said" are used to refer to a noun previously introduced by the indefinite article "a" or "an," "the" and "said" mean "at least one" or "one or more" unless the usage unambiguously indicates otherwise.

It should also be understood that although certain drawings illustrate hardware and software located within particular devices, these depictions are for illustrative purposes only. In some embodiments, the illustrated components may be combined or divided into separate software, firmware, and/or hardware. For example, instead of being located within and performed by a single electronic processor, logic and processing may be distributed among multiple electronic processors. Regardless of how they are combined or divided, hardware and software components may be located on the same computing device or may be distributed among different computing devices connected by one or more networks or other suitable connections or links.

Thus, in the claims, if an apparatus or system is claimed, for example, as including an electronic processor or other element configured in a certain manner, for example, to make multiple determinations, the claim or claim element should be interpreted as meaning one or more electronic processors (or other element) where any one of the one or more electronic processors (or other element) is configured as claimed, for example, to make some or all of the multiple determinations collectively. To reiterate, those electronic processors and processing may be distributed.

Also, it is to be understood that the phraseology and terminology used herein is for the purpose of description and should not be regarded as limiting. The terms "mounted," "connected" and "coupled" are used broadly and encompass both direct and indirect mounting, connecting, and coupling. Further, "connected" and "coupled" are not restricted to physical or mechanical connections or couplings, and can include electrical connections or couplings, whether direct or indirect. Also, electronic communications and notifications may be performed using any known means including wired connections, wireless connections, etc.

For ease of description, some or all of the example systems presented herein are illustrated with a single exemplar of each of its component parts. Some examples may not describe or illustrate all components of the systems. Other instances may include more or fewer of each of the illustrated components, may combine some components, or may include additional or alternative components.

FIG. 1 is a block diagram of an electronic communications network 100 (also referred to herein as network system 100) in accordance with some aspects. In some aspects, the network 100 is a security surveillance network, for example, for monitoring a single, physical building structure or area (for example, a commercial or business building, a store, a warehouse facility, a shipping yard, etc.). The network 100 includes a control panel 102 and one or more of an electronic communication expander device (for example, electronic communication expander device 200A, 200B, and 200N, singularly referred to herein as electronic communication expander device 200). The control panel 102 is configured to communicate via a wired, half-duplex serial communication with at least one expander device 200. In the illustrated example, the control panel 102 is communicatively coupled directly to a serial bus interface of the expander device 200 (illustrated in and described in more detail below with respect to FIG. 2) via a serial half-duplex differential communications bus 108A. In some aspects, the control panel 102 may communicate with the expander device 200 through another network device (for example, a network switch or another expander device 200). As illustrated in FIG. 1, for example, the expander device 200B exchanges communications with the control panel 102 through the expander device 200A.

The control panel 102 may be a user electronic communications device suitable for handling and processing communications of the network 100. The control panel 102 may be or include, for example, a desktop or laptop computer, a server, a tablet, and the like.

Each expander device 200 (described in more detail below with respect to FIG. 2) includes at least two serial communication interfaces (ports) through which the respective expander device 200 each exchange wired serial communications with one or more additional electronic communications devices. The additional devices may include one or more peripheral devices (for example, peripheral devices 106A-106F, singularly referred to herein as peripheral device 106), one or more expander devices 200, the control panel 102, or some combination thereof depending on the particular topology of the network 100.

The expander device 200 is provided to extend a physical range of one or more communications buses of the network. For example, in some aspects, the distance between an expander device 200 communicatively coupled (via a wired connection) to another device (i.e., the control panel 102, another expander device 200, or a peripheral device 106) is approximately 1000 feet (ft).

The peripheral devices 106 include one or more security monitoring/access control devices being or including sensor modules (for example, surveillance cameras, infrared sensors, RFID/card scanners, etc.), human interface modules (for example, keypads, touchscreen displays, etc.), and output modules (for example, visual alarms, audio alarms, etc.). The peripheral devices 106 may include, for example, one or more sensors (for example, biometric sensors, RFID tag sensors, surveillance cameras, motion sensors, etc.), human interfaces (for example, a keypad, a pushbutton, etc.), entryway access control modules (for example, an electronic door lock or a window lock, etc.), audible/visual alarms (for example, a siren, a warning light, etc.) and the like.

In the example illustrated, the expander device 200A communicates with the control panel 102 via the differential communications bus 108A. The expander device 200A also communicates with peripheral devices 106A-106C via a differential communications bus 108B. The expander device 200A additionally communicates with the expander device 200B via the differential communications bus 108B. The expander device 200B shares the differential communications bus 108B with the expander device 200A and communicates with devices 106D-106F via a differential communications bus 108C. In some aspects, the expander device 200 is configured to provide power (for example, with respect to device 200A, via the respective serial communications buses 108B and 108C or via a separate connection) to one or more devices connected downstream from the expander device 200. In such aspects, the devices downstream of the expander device 200 include one or more peripheral devices 106, another expander device 200, or some combination thereof. For example, in the example illustrated in FIG. 1, the expander device 200A is configured to provide power (for example, from a battery 240 described with respect to FIG. 2 below) to the peripheral devices 106A-106C and the expander device 200B. Additionally, with reference to the example illustrated in FIG. 1, the expander device 200B may be configured to provide power to the peripheral devices 106D-106F.

Each expander devices 200 is configured to receive communications from the control panel 102 (directly or from another expander device 200 as described above) at a first serial bus interface via a bus (for example, with respect to the expander device 200A, bus 108A) according to a particular communications protocol. The expander device 200 transmits the received communications according to the particular communications protocol to one or more devices from a second serial bus interface of the expander device 200 via a second communications bus. For example, with respect to the expander device 200A, the device 200A transmits communications received from the bus 108A to one or more devices 106A-C and the expander device 200B via the bus 108B. The expander device 200B is configured to receive the communications from the bus 108B and forward the communications (according to the same protocol) to the devices 106D-106F of the bus 108C. As illustrated, additional expander device 200N may be connected (for example, daisy-chained) together from the expander device 200B via the bus 108C and may further communicate with one or more additional peripheral devices 106, expander devices 200, or some combination thereof.

As used herein, with respect to a single expander device 200, the term "upstream" refers to devices (and respective connections) between (and including) the control panel 102 and the expander device 200. As also used herein, the term "downstream" with respect to a single expander device 200 refers to devices between the expander device 200 and any peripheral devices 106 at the edge of the network 100. As an example, with respect the expander device 200A of FIG. 1, the control panel 102 is a device upstream from the expander device 200A and devices 106A-106F and the expander device 200B are devices downstream from the expander device 200A.

It should also be understood, as further described below, that the topology of the network 100 is not limited to the example illustrated in FIG. 1. For example, a different number of expander devices 200N may be communicatively coupled directly to the control panel 102 and to any number of peripheral device 106 or expander devices 200 communicatively coupled downstream therefrom.

As described above, the buses 108A-108C (collectively referred to herein as communications bus 108) are all half-duplex differential communications buses. Thus, only one device connected to the bus may transmit at a time, while any other device(s) connected to the bus receive the transmission from the transmitting device. While a device is transmitting over the bus (also known as "driving the bus" in the case of a differential communications bus), none of the other connected devices are able to transmit over the bus until the transmitting device stops transmitting over the bus ("releases the bus"). For example, with respect to bus 108B, if any one of the expander devices 200A, 200B or the peripheral devices 106A-106C begin transmitting over the bus 108B, all the other remaining devices receive the transmission and are unable to transmit over the bus.

Figures 2, 3:
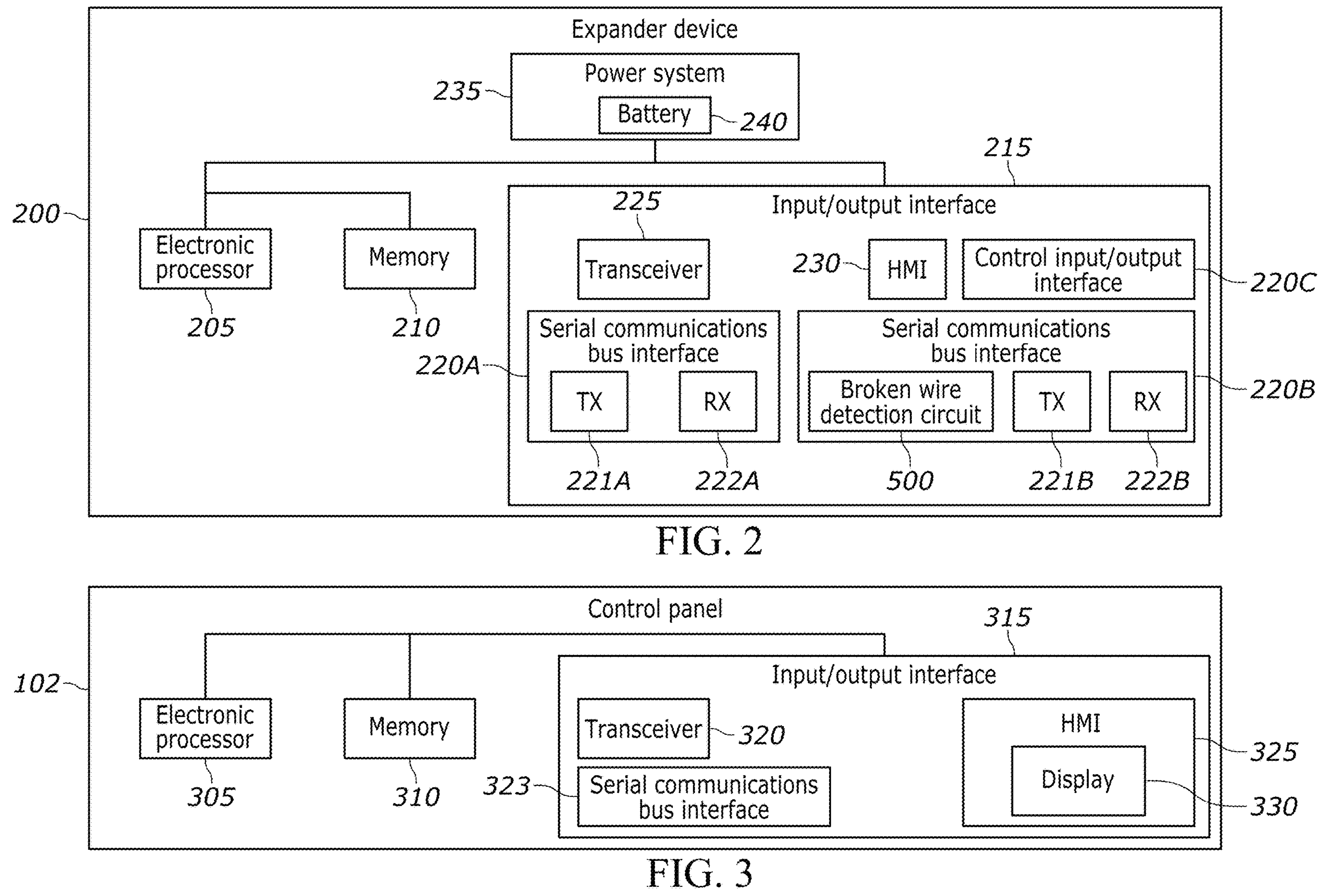
FIG. 2 illustrates an electronic communications expander device of the system of FIG. 1 according to various examples.
FIG. 3 illustrates a control panel of the system of FIG. 1 according to various examples.

FIG. 2 is a diagram of an example of the expander device 200. In the aspect illustrated, the expander device 200 includes an electronic processor 205, a memory 210, an input/output interface 215. In some aspects, the expander device 200 includes a transceiver 225. The illustrated components, along with other various modules and components (not shown) are coupled to each other by or through one or more control or data buses that enable communication therebetween.

The electronic processor 205 obtains and provides information (for example, from the memory 210 and/or the input/output interface 215), and processes the information by executing one or more software instructions or modules, capable of being stored, for example, in a random access memory ("RAM") area of the memory 210 or a read only memory ("ROM") of the memory 210 or another non-transitory computer readable medium (not shown). The software can include firmware, one or more applications, program data, filters, rules, one or more program modules, and other executable instructions. The electronic processor 205 is configured to retrieve from the memory 210 and execute, among other things, software related to the control processes and methods described herein.

The memory 210 can include one or more non-transitory computer-readable media and includes a program storage area and a data storage area. The program storage area and the data storage area can include combinations of different types of memory, as described herein.

The input/output interface 215 is configured to receive input and to provide system output. The input/output interface 215 obtains information and signals from, and provides information and signals to, (for example, over one or more wired and/or wireless connections) devices both internal and external to the expander device 200. The input/output interface may include one or more wired interfaces (e.g., a USB port, an Ethernet port, etc.) and/or one or more wireless transceivers (for example, the transceiver 225) or interfaces (configured, for example, to transmit and/or receive information via one or more wireless communication protocols such as 802.11a/b/g/n, Bluetooth, near field communication (NFC), ZigBee, and so forth).

In one example, the input/output interface 215 includes a first serial communications bus interface 220A and a second serial communications bus interface 220B. As described above, the expander device 200 is configured to communicate with one or more devices of the network 100 via a respective wired bus connection at each of the serial communications bus interfaces 220A, 220B. In some aspects, the device 200 only includes two serial communications bus interfaces. Each of the bus interfaces 220A, 220B is configured to connect to a respective differential communications bus (for example, communications buses 108A-108C of FIG. 1). Each of the bus interfaces 220A and 220B each include at least one differential transmitter 221A, 221B (collectively referred to herein as transmitter 221) and differential receiver 222A, 222B (collectively referred to herein as receiver 222). In some aspects, a differential transmitter 221 and differential receiver 222 of a bus interface 220A, 220B may be part of a single differential transceiver unit.

As described in more detail below with respect to FIGS. 4-6, at least one of the bus interfaces 220A, 220B includes a broken wire detection circuit 500. In some aspects, both bus interfaces 220A and 220B include a broken wire detection circuit 500. The expander device 200 is configured to use the broken wire detection circuit 500 to determine whether a broken wire condition (referred to herein as a "broken wire condition" and alternatively as an "open wire condition") is present on bus connected directly downstream from the expander device 200 at an interface (for example, with respect to expander device 200A of FIG. 1, the bus 108B). A broken wire condition refers to any kind of damage to a wire of a communications bus that impacts transmissions across the bus.

In some aspects, the expander device 200 includes a control input/output interface 220C for communicatively coupling to one or more additional devices of the network 100 (not shown). The interface 220C may be, for example a port for a wired connection (for example, an Ethernet port).

In some aspects, the expander device 200 includes a transceiver 225 (part of the input/output interface 215). The transceiver 225 is configured to transmit and receive wireless communications (for example, from the control panel 102 or another electronic communications device). The transceiver 225 may include various digital and analog components, which for brevity are not described herein and which may be implemented in hardware, software, or a combination of both. Some aspects include separate transmitting and receiving components, for example, a transmitter and a receiver, instead of a combined transceiver 225.

Optionally, in some aspects, the input/output interface 215 includes a human machine interface (HMI) 230. The HMI 230 receives input from, and provides output to, users of the expander device 200. The HMI 230 may include a keypad, switches, buttons, soft keys, indictor lights, haptic vibrators, a display (e.g., a touchscreen), or some combination thereof. In some aspects, the expander device 200 is user configurable via the HMI 230.

In some aspects, the expander device 200 also includes a power supply system 235. The power supply system 235 includes, among other things, a battery 240. The battery 240 includes one or more batteries that provide power to one or more components of the expander device 200. In some embodiments, the battery 240 is separate from the expander device 200 (for example, disposed within an enclosure separate from the expander device 200). In some aspects, as mentioned above, the expander device 200 is also configured to provide power from the power supply system 235 to one or more additional devices of the network 100 (for example, one or more peripheral devices 106 connected downstream from the expander device 200).

FIG. 3 is a diagram of an example of the control panel 102 in accordance with some aspects. In the example provided, the control panel 102 includes an electronic processor 305, a memory 310, and an input/output interface 315 including a transceiver 320 and, optionally, a human machine interface (HMI) 325. The illustrated components, along with other various modules and components (not shown) are coupled to each other by or through one or more control or data buses that enable communication therebetween.

The electronic processor 305 obtains and provides information (for example, from the memory 310 and/or the input/output interface 315) and processes the information by executing one or more software instructions or modules, capable of being stored, for example, in a random access memory ("RAM") area of the memory 310 or a read only memory ("ROM") of the memory 310 or another non-transitory computer readable medium (not shown). The software can include firmware, one or more applications, program data, filters, rules, one or more program modules, and other executable instructions. The electronic processor 305 is configured to retrieve from the memory 310 and execute, among other things, software to carry out the methods described herein.

The memory 310 can include a program storage area and a data storage area. The program storage area and the data storage area can include combinations of different types of memory, as described herein.

The input/output interface 315 is an electronic communication interface configured to receive input and to provide system output. The input/output interface 315 obtains information and signals from, and provides information and signals to devices (for example, over one or more wired and/or wireless connections) both internal and external to the control panel 102. The input/output interface 315 may include a wireless transmitter or transceiver for wirelessly communicating over the network 100. Alternatively, or in addition to a wireless transmitter or transceiver, the input/output interface 315 may include a port for receiving a cable, such as an Ethernet cable, for communicating over the network 100 or a dedicated wired connection. It should be understood that, in some aspects, the control panel 102 communicates with other devices through one or more intermediary devices, such as routers, gateways, relays, and the like (for example, the network switch 104 of FIG. 1). In some embodiments, the control panel 102 includes one or more of a communications bus interface 323.

As mentioned above, in some aspects the control panel 102 may include the HMI 325. The HMI 325 receives input from, and provides output to, users of the control panel 102. The HMI 325 may include a keypad, switches, buttons, soft keys, indictor lights, haptic vibrators, a display (for example, the display 330) configured, for example, as a touchscreen, or some combination thereof. In some aspects, the control panel 102 is user configurable via the HMI 325. In some aspects, the user is able to access information received from one or more devices of the network 100 via the HMI 325 of the control panel 102.

The display 330 is a suitable display (for example, a liquid crystal display (LCD) touch screen, or an organic light-emitting diode (OLED) touch screen). In some aspects, the control panel 102 displays a graphical user interface (GUI) (for example, generated by the electronic processor 305, from instructions and data stored in the memory 310, and presented on the display 330), that enables a user to interact with the control panel 102. In some aspects, the control panel 102 enables display remotely, for example, using a display (configured similarly to the display of the HMI 220) of one or more of the devices of the network 100 (for example, one or more of the peripheral devices 106A-106H or an expander device 200) or another suitable device in communication with the control panel 102.

As mentioned above, the expander device 200 includes a broken wire detection circuit 500. FIG. 4 illustrates the communications network 100 of FIG. 1 including the control panel 102 and expander devices 200A and 200B. Each of the buses 108A-108C of FIG. 1 are each illustrated in FIG. 4 as a respective pair of differential communication wires. For example, differential communications bus 108A is illustrated as positive differential wire 402A and neutral or negative wire 402B. Similarly, differential communications bus 108B is illustrated positive differential wire 404A and neutral or negative wire 404B and bus 108C is positive differential wire 406A and neutral or negative wire 406B. For ease of description, the peripheral devices 106A-106C are illustrated as a single device 106G and peripheral devices 106D-106F are illustrated as a single peripheral device 106H. Again, it should be understood that any bus can include any number of expander devices 200, peripheral devices 106, or some combination thereof.

Figure 4:
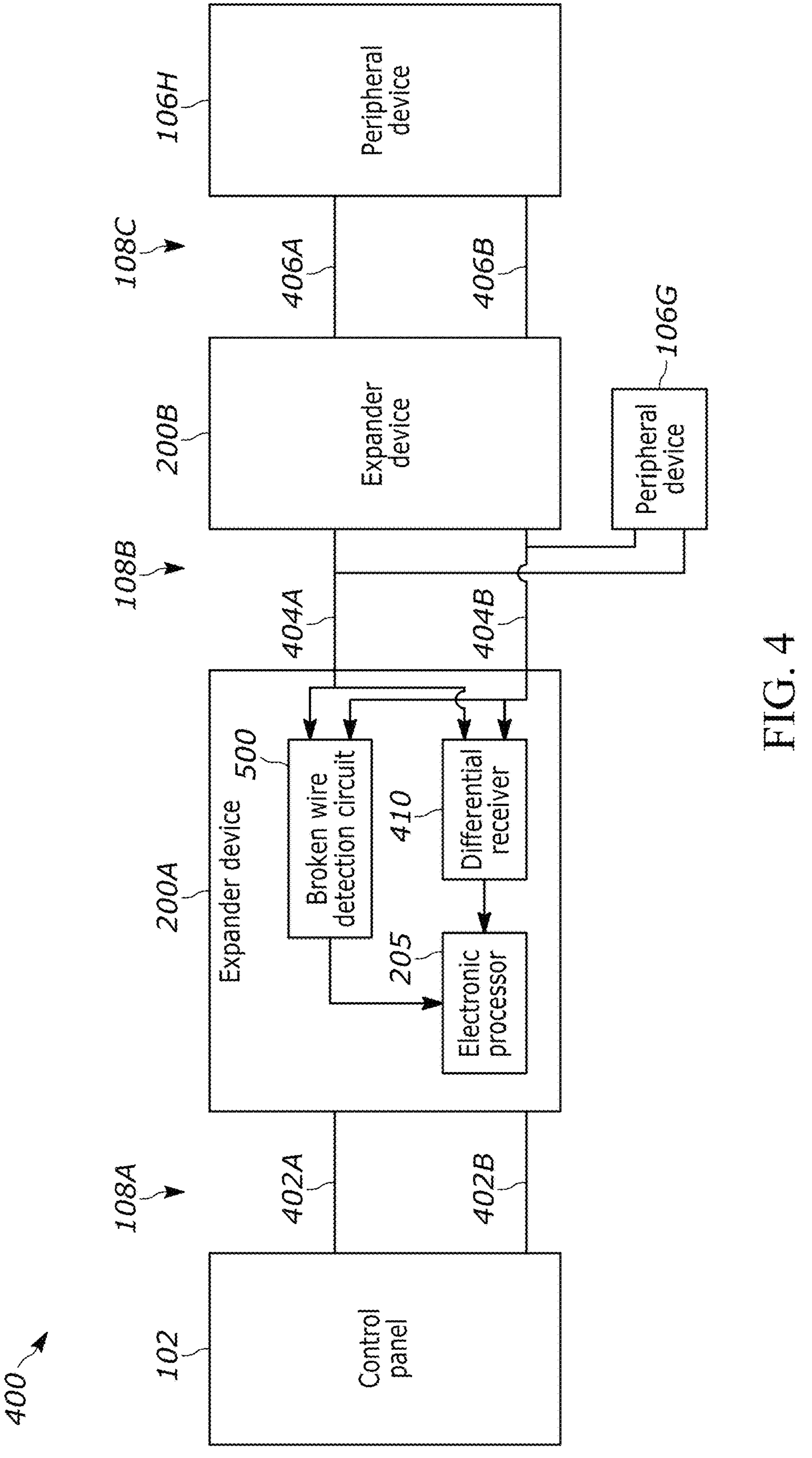
FIG. 4 is a block diagram illustrating the communications system of FIG. 1 including a broken wire detection circuit of the expander device of FIG. 2 according to various examples.

The example illustrated in FIG. 4 is herein described in terms of the expander device 200A, which includes a respective broken wire detection circuit 500. For ease of description, the functionality of the broken wire detection performed by an expander device is described here with respect to expander device 200A and bus 108B. It should be understood that the expander device 200B includes similar components and functions similar to that of expander device 200A with respect to bus 108C.

The expander device 200A (in particular, the serial communications bus interface 220B, which is not illustrated here, connected to the downstream bus 108B) additionally includes an opto-coupler 50 configured to provide the received signal to the electronic processor 205 and is connected to an output of the broken wire detection circuit 500. In some aspects, the coupler 50 is alternatively a level-shifter/level converter circuit. The differential receiver 410 may be part of a differential transceiver (which is not shown) of the interface 220B or a separate receiving component. The broken wire detection circuit 500 is connected at an input to the communications bus 108B (wires 404A and 404B). The electronic processor 205A of the expander device 200A is configured to receive communications from the differential receiver 410 as described in more detail below.

Figure 5:
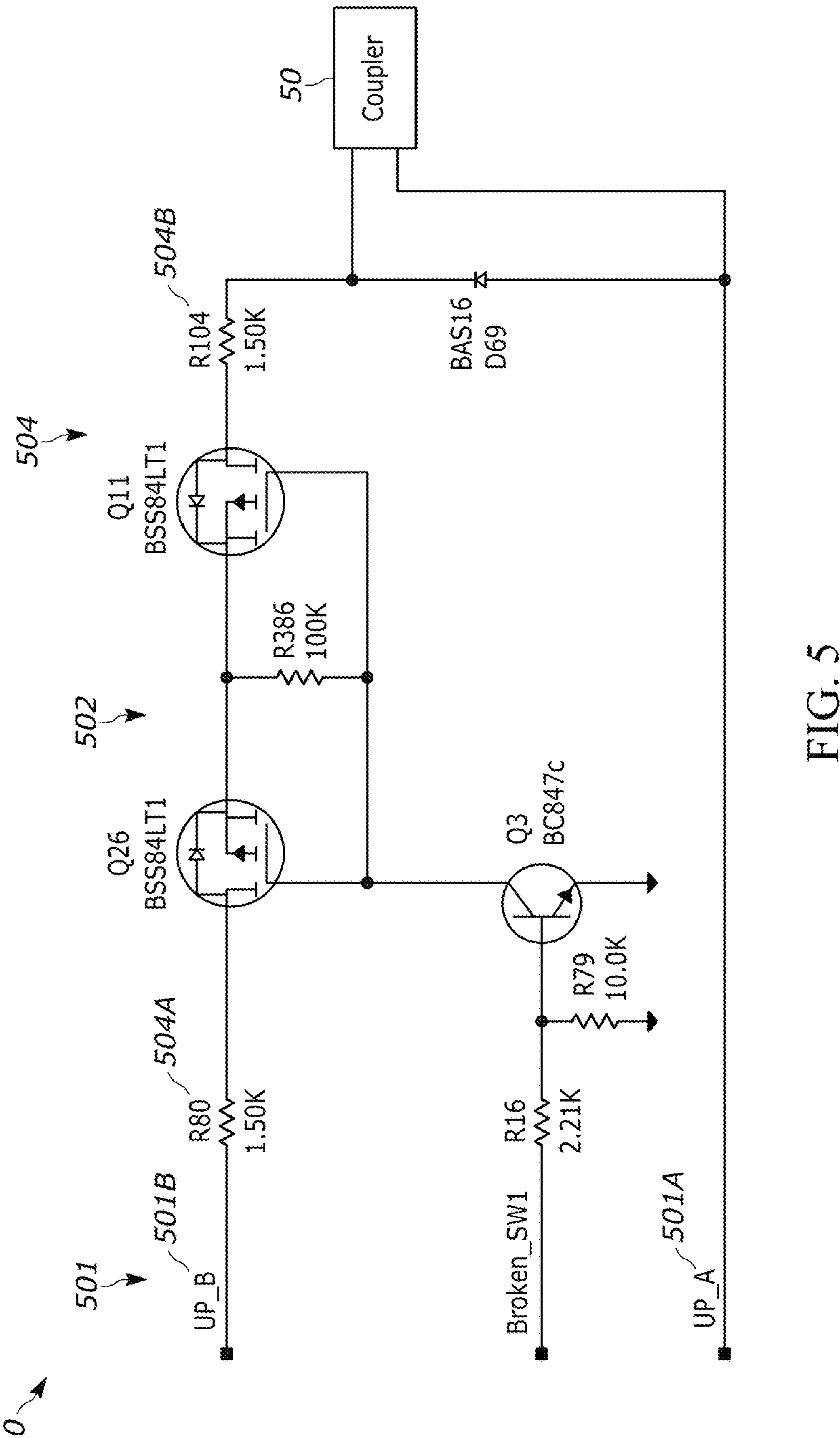
FIG. 5 is a circuit diagram of the broken wire detection circuit of the expander device of FIG. 2 according to various examples.

FIG. 5 is a circuit diagram of the broken wire detection circuit 500 in accordance with some aspects. As illustrated, the circuit 500 is connected to a bus 108 (differential wires 501A and 501B) at an input 501 of the circuit 500. The broken wire detection circuit 500 also includes one or more of a load resistor 504 at the input 501. The load resistor 504, in some aspects, is divided into more than one resistor. The load resistor 504 is selectively connectable to the input 501 of the circuit 500 (for example, via a switch 502, including, for example, transistors Q3, Q11, and Q26). When the switch 502 is not activated by the electronic processor 205 (for example, transistor Q3), the load resistor 504 is not connected to the input 501.

In the illustrated example, the load resistor 504 is divided into two resistors 504A and 504B. For example, as the signals on wires 501A and 501B are differential signals, there may be instances where the signal on one wire is larger than the signal on the other wire. Depending on which wire 501A, 501B has a higher voltage for a given signal, the second resistor may be used to ensure enough of a gate-source voltage drop is provided to the switch 502.

As previously described above, utilizing an EOL resistor at peripheral devices 106 at the edge(s) of the network 100 for broken wire detection may be costly and complicated to install. Such a solution may also make it difficult to make modifications to the network, as changes in the topology may require relocation or new installation of one or more of the EOL resistors. In contrast, the proposed aspects and examples described herein provide a load resistor within the expander devices 200, rather than at any of the peripheral devices. Thus, any changes to the network 100 regarding adding, removing, or moving peripheral devices 106 may not necessitate additional installation or removal of EOL resistors.

As illustrated, the circuit 500 includes the coupler 50, the output of which is provided to the electronic processor 205. In some aspects, the broken wire detection circuit 500 consists of only discrete logic components.

Figure 6:
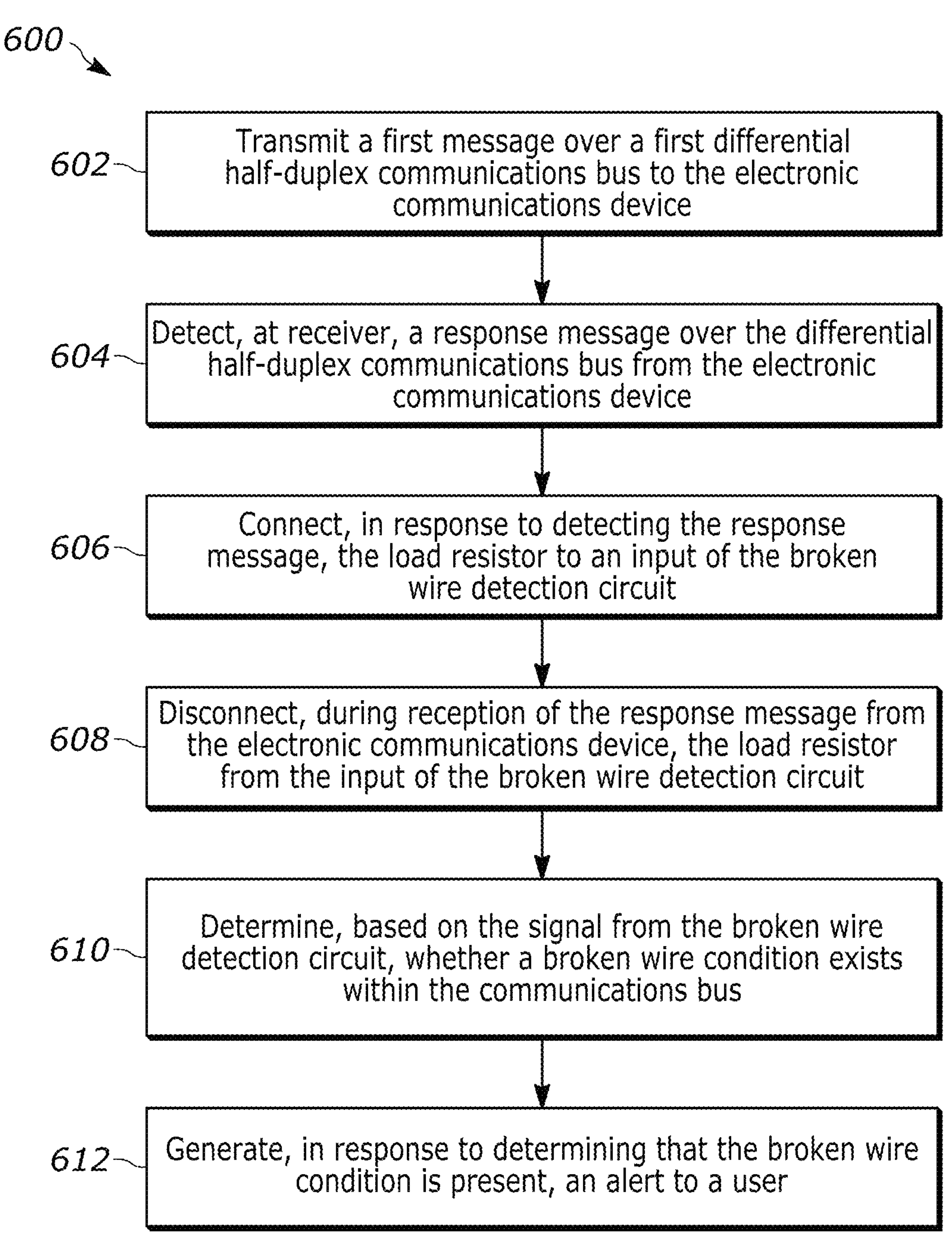
FIG. 6 is a flowchart of a method of detecting a broken wire condition within a network implemented by the device of FIG. 2 in accordance with various examples.

FIG. 6 illustrates an example method 600 of detecting a broken wire condition within the network 100 in accordance with some aspects. The method 600 may be modified or performed differently than the specific example provided. As an example, the method 600 is described as being performed by the expander device 200A and, in particular, by the electronic processor 205A and in terms of the network 400 illustrated in FIG. 4. It should be understood that any expander device 200 within the network 100 is also configured to perform the method 600 (for example, expander device 200B).

At block 602, the electronic processor 205A transmits (for example, via the differential transmitter 221B of FIG. 2) a first message over a differential communications bus to an electronic communications device (for example, a peripheral device 106 or another expander device 200). The differential communications bus is a bus directly downstream from the expander device 200A. For example, with respect to the example illustrated in FIG. 4, the electronic processor 205A transmits a message over the communications bus 108B (wires 404A and 404B). In some aspects, the electronic processor 205A is configured to transmit the message in response to receiving a message from the control panel 102. For example, the control panel 102 may transmit a message to verify an address of one of the devices of the network 100. In some aspects, in instances where the message from the control panel 102 is a message for a device downstream from the expander device 200A, the expander device 200A forwards the message over the bus 108A.

At block 604, the electronic processor 205A detects, at a differential receiver (for example, the receiver 410), a response message over the differential communications bus 108B from an electronic communications device on the differential communications bus 108B. The response message is transmitted from the device that the first message from the expander device 200A was addressed to (for example, peripheral device 106G or the expander device 200B).

At block 606, the electronic processor 205A connects, in response to detecting the response message, the load resistor 504 to the input 501 of the broken wire detection circuit 500 and, at block 608, disconnects the load resistor 504 from the input 501 during reception of the response message. In some aspects, the electronic processor 205A connects the load resistor 504 for one or more bits including in the response message. For example, in some aspects, the electronic processor 205A is configured to detect, at the receiver 410A, an end a first bit of the response message and connect the load resistor 504 to the input 501 in response. The electronic processor 205A may be further configured to detect, at the receiver 410A, an end of a second bit of the response message and disconnect the load resistor 504 from the input 501 in response to detecting the end of the second bit.

At block 608, the electronic processor 205A determines, based on the signal from the broken wire detection circuit 500 received at the receiver 410A, whether a broken wire condition exists within the first differential half-duplex communications bus 108B. In some aspects, the signal from the broken wire detection circuit 500 includes a signal from the load resistor 504 corresponding to the received second bit. In such aspects, the electronic processor 205A is configured to determine whether a broken wire condition is present based on a comparison between the signal from the load resistor 504 and a received second bit of the message received at the differential receiver (for example, the receiver 410) of the expander device 200 from the differential communications bus 108B.

The selective connection of the load resistor 504 to the differential communications bus 108B for determining a broken wire condition may be done, as opposed to having a load resistor always connected to the bus 108B at the expander device 200A is done, for example, to prevent distortion of a start bit of the message.

Each expander device 200 within the network 100 is configured to detect a broken wire condition only for a bus connected directly downstream from itself. For example, with reference to FIG. 4, the expander device 200A detects whether there is a broken wire condition on bus 108B and the expander device 200B detects whether there is a broken wire condition on bus 108C. When the expander device 200 receives (or generates) a transmission for a device downstream from it, the device 200 may not be aware as to whether or not the device the transmission is addressed to is on the bus directly downstream from it (for example, with respect to expander device 200A, bus 108B) or on another bus further downstream (for example, bus 108C). If each expander device 200 between the control panel 102 and the responding device kept their respective load resistor 504 connected to their respective downstream bus 108, the response message from the device may become distorted by the plurality of load resistors by the time the message is received at the control panel 102. Thus, each expander device 200 is configured to connect the load resistor 504 of their respective broken wire detection circuit 500 to their respective downstream bus 108 for only a portion of the response from the device 106.

At block 612, the electronic processor 205A, in response to determining that the broken wire condition is present, an alert to a user. The alert may be any kind of visual or audible alert or some combination thereof. The alert may be output to the user at the expander device 200A itself, for example, via the HMI 230. In some aspects, the expander device 200A transmits a command to the control panel 102 to generate the alert at the control panel 102 (for example, via the HMI 325). The alert may be generated on a display of an HMI 230, 325, via one or more warning lights, via one or more alarms, or some combination thereof. In some aspects, the alert includes information regarding the location of the broken wire condition (for example, which devices are on the affected bus).

Thus, the systems and methods described herein provide for, among other things, broken wire detection at an expander device of a network (for example, a security surveillance network).

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain implementations and should in no way be construed to limit the claims.

Accordingly, it is to be understood that the above description is intended to be illustrative and not restrictive. Many aspects and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future aspects. In sum, it should be understood that the application is capable of modification and variation.

Various features and advantages of the aspects presented herein are set forth in the following claims.

What is claimed is:

1. An electronic communications system expander device communicatively coupled via a first differential half-duplex communications bus to and upstream from an electronic communications device, the electronic communications system expander device comprising:

a differential receiver;

an electronic processor; and a broken wire detection circuit including a load resistor selectively connectable to an input of the broken wire detection circuit, the broken wire detection circuit being communicatively coupled at the input to the first differential half-duplex communications bus and communicatively coupled at an output to the electronic processor, wherein the electronic processor configured to:

transmit a first message over the first differential half-duplex communications bus to the electronic communications device;

detect, at the differential receiver, a response message over the first differential half-duplex communications bus from the electronic communications device;

connect, in response to detecting the response message, the load resistor to the input of the broken wire detection circuit;

disconnect, during reception of the response message from the electronic communications device, the load resistor from the input of the broken wire detection circuit;

determine, based on a signal from the broken wire detection circuit, whether a broken wire condition exists within the first differential half-duplex communications bus; and generate, in response to determining that the broken wire condition is present, an alert to a user.

2. The expander device of claim 1, wherein the electronic processor is further configured to:

detect, at the differential receiver, an end a first bit of a message from the electronic communications device;

connect, in response to detecting the end of the first bit, the load resistor of the broken wire detection circuit to the input of the broken wire detection circuit;

detect, at the differential receiver, an end of a second bit of the message from the electronic communications system expander device; and disconnect, in response to detecting the end of the second bit, the load resistor from the input of the broken wire detection circuit.

3. The expander device of claim 2, wherein the signal from the broken wire detection circuit includes a signal from the load resistor corresponding to the received second bit, and wherein the electronic processor is configured to determine whether a broken wire condition is present based on a comparison between the signal from the load resistor and a received second bit of the message received at the differential receiver of the expander device from the differential half-duplex communications bus.

4. The expander device of claim 1, wherein the load resistor includes two resistors.

5. The expander device of claim 1, wherein generating the alert includes transmitting an alert notification to a control panel communicatively coupled upstream from the electronic communications system expander device via a second differential half-duplex communications bus.

6. The expander device of claim 5, wherein the electronic communications system expander device and the control panel are part of a security surveillance system.

7. The expander device of claim 1, wherein the electronic communications device is either one of another electronic communications system expander device or a peripheral device.

8. The expander device of claim 7, wherein the peripheral device includes at least one selected from the group consisting of a biometric sensor, an RFID tag sensor, a surveillance camera, a motion sensor, an entryway access control module, and an alarm system.

9. An electronic communications network system including an electronic communications device and an expander device communicatively coupled via a first differential half-duplex communications bus to and upstream from the electronic communications device, the electronic communications system expander device including a differential receiver, an electronic processor, and a broken wire detection circuit including a load resistor selectively connectable to an input of the broken wire detection circuit, the broken wire detection circuit being communicatively coupled at the input to the first differential half-duplex communications bus and communicatively coupled at an output to the electronic processor, wherein the electronic processor is configured to:

transmit a first message over the first differential half-duplex communications bus to the electronic communications device;

detect, at the differential receiver, a response message over the first differential half-duplex communications bus from the electronic communications device;

connect, in response to detecting the response message, the load resistor to the input of the broken wire detection circuit;

disconnect, during reception of the response message from the electronic communications device, the load resistor from the input of the broken wire detection circuit;

determine, based on a signal from the broken wire detection circuit, whether a broken wire condition exists within the first differential half-duplex communications bus; and generate, in response to determining that the broken wire condition is present, an alert to a user.

10. The system of claim 9, wherein the electronic processor is further configured to:

detect, at the differential receiver, an end a first bit of a message from the electronic communications device;

connect, in response to detecting the end of the first bit, the load resistor of the broken wire detection circuit to the input of the broken wire detection circuit;

detect, at the differential receiver, an end of a second bit of the message from the electronic communications system expander device; and disconnect, in response to detecting the end of the second bit, the load resistor from the input of the broken wire detection circuit.

11. The system of claim 10, wherein the signal from the broken wire detection circuit includes a signal from the load resistor corresponding to the received second bit, and wherein the electronic processor is configured to determine whether a broken wire condition is present based on a comparison between the signal from the load resistor and a received second bit of the message received at the differential receiver of the expander device from the differential half-duplex communications bus.

12. The system of claim 9, wherein the load resistor includes two resistors.

13. The system of claim 9, wherein generating the alert includes transmitting an alert notification to a control panel communicatively coupled upstream from the electronic communications system expander device via a second differential half-duplex communications bus.

14. The system of claim 13, wherein the system is a security surveillance system.

15. The system of claim 9, wherein the electronic communications device is either one of another electronic communications system expander device or a peripheral device.

16. The expander device of claim 15, wherein the peripheral device includes at least one selected from the group consisting of a biometric sensor, an RFID tag sensor, a surveillance camera, a motion sensor, an entryway access control module, and an alarm system.

17. A method of detecting a broken wire condition of a first differential half-duplex communications bus, the method comprising:

transmitting, from an electronic communications system expander device, a first message over the first differential half-duplex communications bus to an electronic communications device connected downstream from the electronic communications system expander device;

detecting, at a differential receiver of the electronic communications system expander device, a response message over the first differential half-duplex communications bus from the electronic communications device;

connecting, in response to detecting the response message, a load resistor of a broken wire detection circuit of the electronic communications system expander device to an input of the broken wire detection circuit, the broken wire detection circuit being connected to the first differential half-duplex communications bus at the input;

disconnecting, during reception of the response message from the electronic communications device, the load resistor from the input of the broken wire detection circuit;

determining, based on a signal from the broken wire detection circuit, whether a broken wire condition exists within the first differential half-duplex communications bus; and generating, in response to determining that the broken wire condition is present, an alert to a user.

18. The method of claim 17, the method further comprising detecting, at the differential receiver, an end a first bit of a message from the electronic communications device;

connecting, in response to detecting the end of the first bit, the load resistor of the broken wire detection circuit to the input of the broken wire detection circuit;

detecting, at the differential receiver, an end of a second bit of the message from the electronic communications system expander device; and disconnecting, in response to detecting the end of the second bit, the load resistor from the input of the broken wire detection circuit.

19. The method of claim 18, wherein the signal from the broken wire detection circuit includes a signal from the load resistor corresponding to the received second bit, and wherein determining whether a broken wire condition is present based on a comparison between the signal from the load resistor and a received second bit of the message received at the differential receiver of the expander device from the differential half-duplex communications bus.

* * * * *